United States Patent [19]

Okabe et al.

[11] 3,765,963

[45] Oct. 16, 1973

[54] METHOD OF MANUFACTURING SEMICONDUCTOR DEVICES

[75] Inventors: Taro Okabe, Tokyo; Eiki Tanikawa, Kawasaki, both of Japan

[73] Assignee: Fujitsu Limited, Kawasaki, Japan

[22] Filed: Mar. 24, 1971

[21] Appl. No.: 127,628

[30] Foreign Application Priority Data

Apr. 3, 1970 Japan .............................. 45/28357

[52] U.S. Cl. .................. 148/188, 148/186, 148/187

[51] Int. Cl. .............................................. H01l 7/36

[58] Field of Search ..................... 148/188, 186, 187

[56] References Cited

UNITED STATES PATENTS

| | | | |
|---|---|---|---|
| 3,507,716 | 4/1970 | Nishida et al. | 148/187 |
| 3,575,742 | 4/1971 | Gilbert | 148/187 |
| 3,437,533 | 4/1969 | Dingwall | 148/187 |

*Primary Examiner*—G. T. Ozaki

*Attorney*—Curt M. Avery, Arthur E. Wilfond, Herbert L. Lerner and Daniel J. Tick

[57] ABSTRACT

A method of manufacturing semiconductor devices comprises the steps of covering the surface of a semiconductor substrate with an insulating film, leaving a designated surface portion uncovered and exposed. A silica glass film containing an impurity is formed on top of the insulating film and on the said surface portion. Thereafter, the substrate is heated to diffuse the impurity from the glass film into the semiconductor substrate, forming a transmuted layer whose saturated concentration is lower than the concentration of the impurity contained in the glass film and which transmuted layer has an etching rate lower than that of the glass film. After the etching step the glass film is removed from the transmuted layer and from said surface portion by chemical etching.

9 Claims, 7 Drawing Figures

METHOD OF MANUFACTURING SEMICONDUCTOR DEVICES

Our invention relates to a method of manufacturing semiconductor devices such as transistors, thyristors, diodes and the like and has for its principal object to afford and facilitate opening an electrode window easily and reliably in a very small diffusion region of the semiconductor substrate.

The development of semiconductor elements for increased frequencies, and switching transistors of increased speed has been accompanied by minimization of the surface pattern of the elements; and an emitter width in the order of a few microns has been achieved. Before an electrode can be attached to an emitter, a window must be opened on this very small emitter by the photo-etching technique. But the optical precision of photo-etching has reached the limit and the photographic developing of a very small pattern on the designated position of the semiconductor substrate is difficult. Due to this difficulty and also due to undesired co-etching of the side face of the oxide film, the emitter junction is liable to become exposed. This problem was initially solved by the method disclosed in Japanese Pat. No. 426,823 in which, utilizing the fact that the thickness of the oxide film above the emitter is smaller than above the other portion in an ordinary planar-type device, the substrate is dipped into the etching liquid after the emitter diffusion is finished, and then the substrate is pulled out of the liquid when the oxide film above the emitter has been removed so that a window can be opened above the emitter.

But in this method an unexpected problem has arisen. Namely, phosphorus is usually utilized as the donor impurity for the emitter diffusion in an npn transistor, and a phosphosilicate glass is formed on the oxide film. The etching rate of the phosphor-silicate glass is larger than the etching rate of the silicon dioxide. Hence, the phosphosilicate glass is soon removed in the above-mentioned etching treatment to cause spreading of the emitter window in the lateral direction. This is particularly detrimental in transistors of a narrow emitter width because the emitter junction of several microns thus becomes exposed, thus causing a short-circuit. On the other hand, as disclosed in the Official Gazettes (Japanese), the Patent Publication Nos. Tokukosho 41-12178 and Tokukosho 43-30098, the phosphosilicate glass can exhibit a passivation effect equivalent to, or exceeding, the passivating effect of a silicon nitride film; but this useful phosphosilicate glass is completely removed by the above-mentioned window-opening etching treatment.

It is, therefore, an object of our invention to provide a semiconductor-device manufacturing method capable of surely and easily opening a window for the emitter electrode on a very small emitter without exposing the emitter junction to the etching treatment.

Another, more specific object of the invention is to afford applying such a window-opening method without the use of an etching resist technique subsequent to the emitter diffusion.

Still another object of our invention is to provide a semiconductor-device manufacturing method capable of opening an electrode window without the use of a photo-resist technique, and leaving, during the etching treatment, a phosphosilicate glass film on the element-protecting film for the purpose of permitting the electrode window to be opened subsequent to the diffusion using phosphorous as the impurity.

These objects can be achieved, according to this invention, by covering the surface of a semiconductor substrate with an insulating film leaving a designated portion of the surface uncovered by the insulating film and exposed, forming a silicate glass film containing an impurity on the insulating film and on said surface portion, heating the substrate to diffuse said impurity into the semiconductor, forming a transmuted layer having a saturated concentration lower than the concentration of said impurity contained in said silicate glass film and having an etching rate lower than the etching rate of said silicate glass film, and then removing the silicate glass film from said transmuted layer and said surface portion by chemical etching.

The above-mentioned and other objects, advantages and features of our invention will be apparent from the following, detailed description of preferred embodiments of the invention presented by way of example on the accompanying drawings in which FIGS. 1 to 4 shown schematically and on enlarged scale, sectional views of different, consecutive stages of a transistor;

FIGS. 1 to 4 relate, for example, to an npn transistor for ultrahigh frequencies which has a very small emitter pattern.

Figure 1:
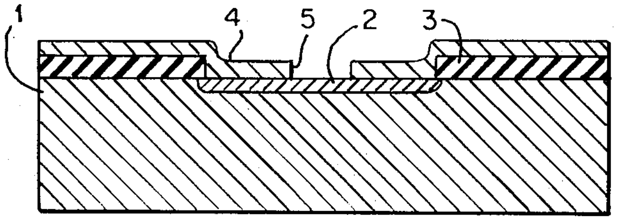
Figure 2:
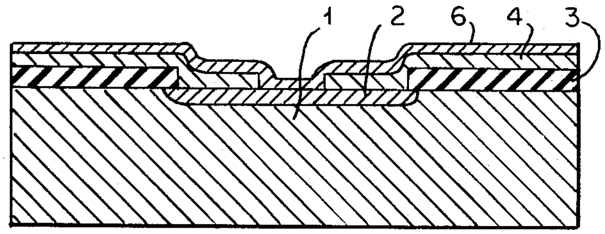

According to FIG. 1, an n-type silicon substrate 1 having an epitaxial layer of 1 ohm·cm resistivity and containing a p-type base region 2 whose depth is 7,500 A(Angstrom) and whose surface concentration is $2 \times 10^{19}$ atoms per $cm^3$. A silicon dioxide mask 3 of 7000 A is used in the base diffusion, and 4 is an oxide film used in the base diffusion. The base diffusion can be accomplished, for example, by providing a base window in the silicon dioxide mask, forming a silicon dioxide film containing boron of 1 mole percent in the form of $B_2O_5$ to a thickness of 4,000 A, and heating the substrate for 15 minutes at 1,150° C. Then the emitter window 5 of 3$\mu$ width is opened in the oxide film 4 by photoetching. Thereafter a phosphosilicate glass film 6 containing phosphorus of 15 mole % as the donor impurity in the form of $P_2O_5$, is formed according to this invention on top of the oxide film 4. This results in the stage shown in FIG. 2. The phosphosilicate glass film 6 can be formed by placing the silicon substrate 1 on a plate heated to 450° C, and applying a reaction gas of $PH_3$ and $O_2$ and $SiH_4$, the flow rate of phosphine $PH_3$ being 30 percent of the flow rate of monosilane $SiH_4$ in the form of $PH_3/(PH_3 + SiH_4)$. The gas flow is applied to said heated plate from above for about 3 minutes using nitrogen as the carrier gas. The concentration of phosphorus in glass film 6 is particularly important as to its relation to the emitter diffusion temperature. In the present example, the emitter diffusion is performed for 25 seconds at 1,250° C. Argon, nitrogen or oxygen can be used as the atmosphere and, as the diffusion time is short, the surface of the silicon is not substantially oxidized.

Figure 3:
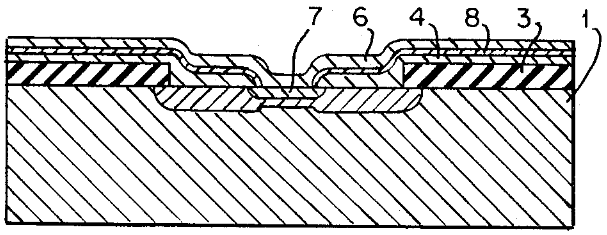
Figure 5:
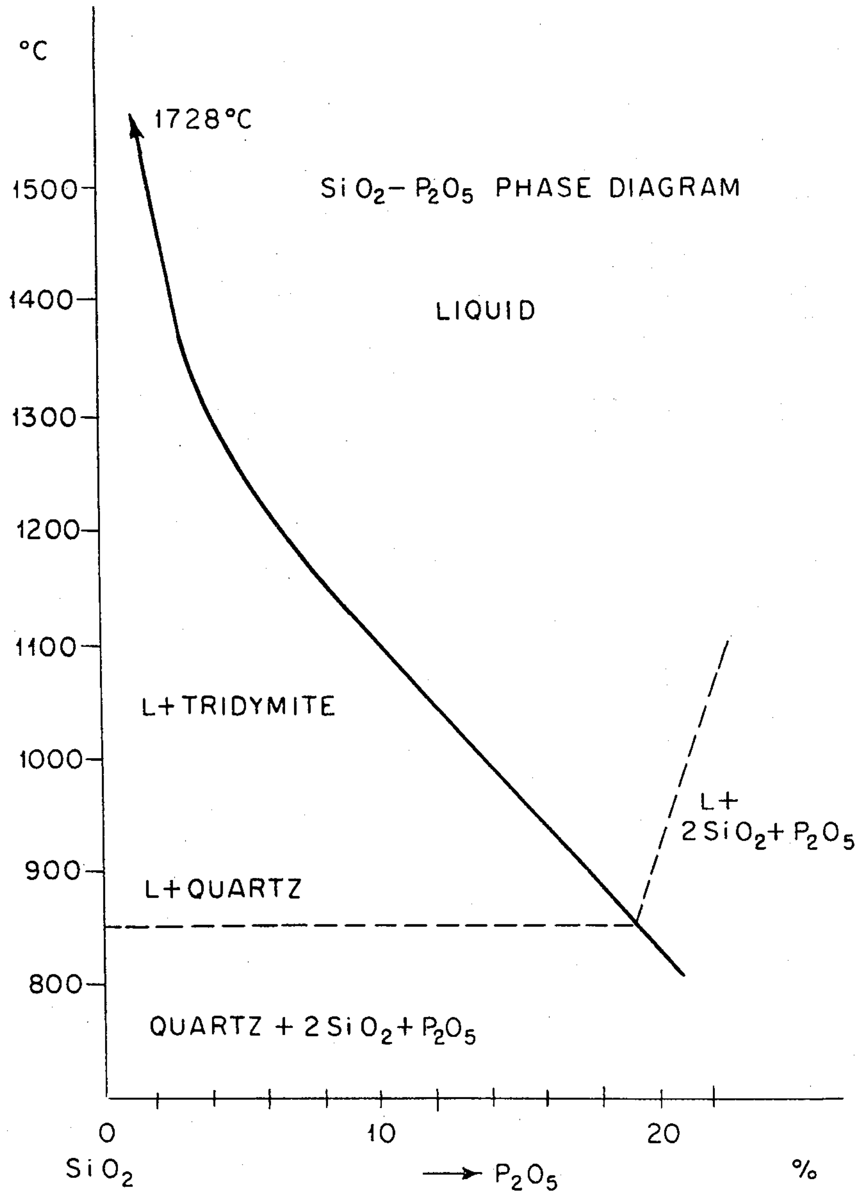
FIGS. 5 and 6 are explanatory graphs.

During the heat treatment for the purpose of the emitter diffusion, as shown in FIG. 3, phosphorus contained in glass film 6 is diffused to form the emitter 7 down to a depth of 6000 A and a surface concentration of $5 \times 10^{20}$ $cm^{-3}$. Simultaneously with the out-diffusion of phosphorus contained in glass film 6, phosphorus is also diffused into the oxide film 4 to form a new transmuted layer 8 of phosphosilicate glass loosely distributed in film 4. The saturated $P_2O_5$ concentration of 5.2 percent, determined by the $SiO_2$-$P_2O_5$ phase diagram of FIG. 5, being the maximum value.

In FIG. 3, the transmuted layer 8 of 2500 – 2600 A thickness is started from a depth of about 1000 A counted from the surface of glass film 6 provided on the collector. The transmuted layer 8 is formed, as described above, by diffusion of phosphorus at the high temperature of 1,250° C. The saturated concentration of $P_2O_5$ in transmuted layer 8 is 5.2 percent which is considerably lower than 15 percent of glass layer 6. It is known that when the mole concentration of $P_2O_5$ within $SiO_2$ is increased by 10 percent, the etching rate of phosphosilicate glass in etching liquid, consisting of 46 percent fluoric acid of 15cc, nitric acid of 10cc and water of 300cc, is increased to about 30 times.

Thus, the etching rate of transmuted layer 8 formed by the high-temperature emitter diffusion becomes lower than the etching rate of glass film 6 used as the diffusion source. The above-mentioned emitter diffusion is called high-temperature diffusion because, while in the prior art boron is first diffused at 1100° – 1150° C and then the emitter diffusion is performed at a lower temperature of 900° – 1000° C, the emitter dffusion in the method of the present invention is performed at a higher temperature within a short period of time and also because, as the result of the diffusion, the transmuted layer with a saturated concentration lower than the phosphorus concentration of the impurity source of the phosphosilicate glass is formed.

Figure 4:
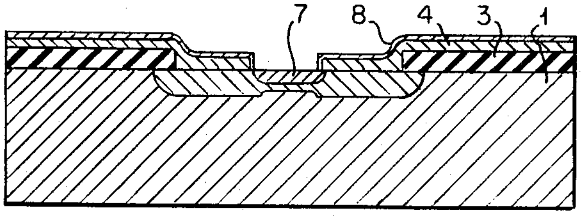

After the high-temperature emitter diffusion, the substrate 1 can be dipped into a conventional etching liquid consisting of 48 percent fluoric acid, ammonium fluoride of 120g and water of 780g held at a temperature of 15° C, and is thus etched in 30 – 40 seconds. By this etching treatment, the glass film 6 on emitter 7 and the transmuted layer 8 are removed, leaving the transmuted layer 8 as shown in FIG. 4. It should be noted that the transmuted layer is also formed on the side wall portions of the oxide film 4 which forms the emitter window 5. In the prior art, the window is expanded in the lateral direction by the removal of the phosphosilicate glass layer; but according to the present invention such spreading of the window can be prevented by this transmuted layer formed on the side wall portions. Therefore even narrow emitter junctions are not exposed.

Figure 7:
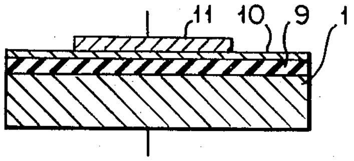
FIG. 7 is a schematic, sectional view of an MOS diode.
Figure 6:
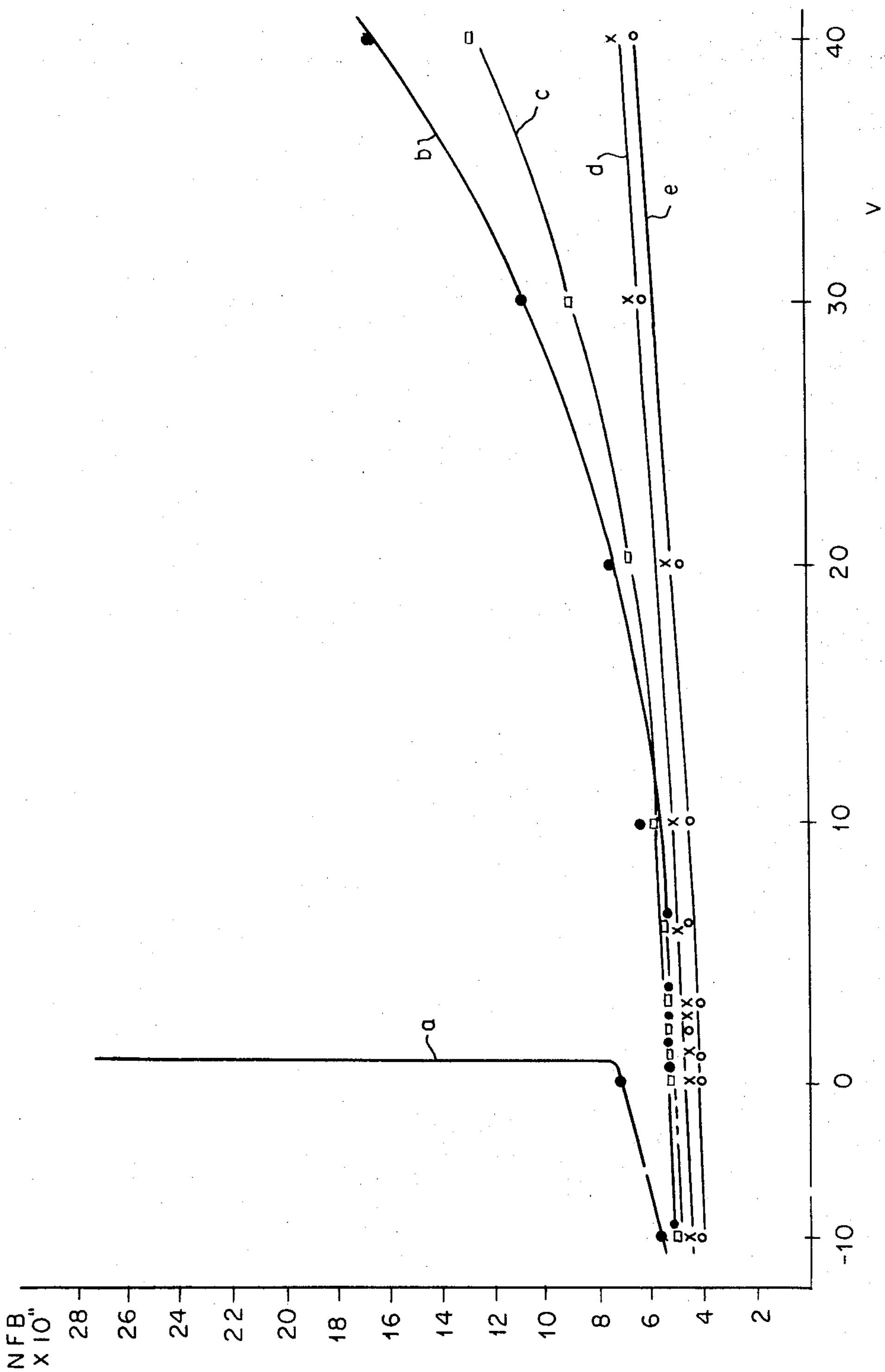

As another important advantage of this embodiment, the transmuted layer 8 is left after opening the emitter electrode window, and thus protects the surface of the semiconductor. That is, transmuted layer 8 has the phosphorus passivation effect. This effect is evident from the coordinate diagram of FIG. 6 showing the relation between the number of surface donors $N_{FB}$ and bias voltage V in the MOS diode of FIG. 7 treated by what is called the BT treatment, i.e., treated at a high temperature with the application of a DC bias on the MOS diode. In the conventional MOS diode having no transmuted layer, $N_{FB}$ is rapidly increased as shown by curve a in FIG. 6. Curves *b, c, d* and *e* relate to MOS diodes treated at temperatures of 1050° C, 1200° C, 1270° C and 1300° C respectively. The MOS diode of FIG. 7 comprises a silicon substrate 1 similar to the silicon substrate used in the embodiment of FIGS. 1 to 4, a silicon dioxide layer 9, a transmuted layer 10 and an aluminum electrode 11 laminated one upon another as shown. The silicon dioxide layer 9 and transmuted layer 10 both have a thickness of 2000 A. The transmuted layer 10 can be formed, as in the embodiment of FIGS. 1 to 4, by depositing a phosphosilicate glass layer containing $P_2O_2$ of 15 mole percent on a silicon dioxide layer, heating the substrate for 30 minutes at 950° C and then dipping the substrate in the abovementioned etching liquid to remove the high-concentration phosphosilicate glass layer, leaving the transmuted layer.

In another embodiment of this invention, an AND (NAND) gate comprising a plurality of transistors the emitters of which are commonly interconnected, is manufactured as follows, the circuitry of this kind of ECL (Emitter Coupled Logic) gate being well known. AND (NAND) is a name of a logic gate circuit used in the digital logic gate circuit. A buried layer is formed on a P-type silicon substrate having a resistivity of 10 ohm·cm by the conventional method, and further an N-type silicon epitaxial layer of 0.3 ohm·cm resistivity and 6μ thickness is formed. Isolation diffusion and collector-contact diffusion are effected successively on this silicon substrate by the conventional method. In the above process, a diffusion mask of silicon dioxide is formed on the surface of the silicon substrate. An opening for the purpose of resistor diffusion and base diffusion is opened on the diffusion mask by the photoetching technique. The silicon substrate is then inserted into a diffusion furnace and heated to 990° C. A reaction gas $BBr_3$ and $O_2$ is passed through the diffusion furnace for 25 minutes using $N_2$ gas as the carrier gas. The glass layer on the silicon surface is removed by etching and then the flow of boron is effected for 40 minutes at 1050° C. During the boron flow, wet $O_2$ which has been passed over water heated to 98° C is introduced into the heating furnace, whereby a diffusion mask of silicon dioxide to be used in the subsequent emitter diffusion is formed on the surface of the base and the resistor. In the boron diffusion, the surface concentration is $2 \times 10^{19}$ $cm^{-3}$, the sheet resistivity is 130 ohm per square and the PN junction is formed to a depth of 0.9μ. An opening for use in the emitter diffusion is opened in the base by photo-etching. A phosphosilicate glass film 6 of 2000 A thickness and a phosphorus concentration of 30 percent is grown from the gaseous phase on the silicon substrate in the same manner as the formation of the phosphosilicate glass film 6 of FIG. 2.

The phosphorus running is effected for 45 seconds at 1250° C. In the phosphorus diffusion, the emitter surface conentration is $1 \times 10^{21}$ $cm^{-3}$ and the sheet resistivity is 7 – 8 ohm per square. During the phosphorus running, a transmuted layer of phosphosilicate glass of 1200 A thickness having a saturated concentration of $P_2O_5$ is 5.2 percent, is formed between the diffusion mask of silicon dioxide and the phosphosilicate glass film.

The current amplification factor $h_{FE}$ of the transistor thus produced was found to be 100 – 150 at a collector current of 10mA and a collector voltage of 5V, $V_{CB}$ was 25V, $V_{CE}$ was 10V and $V_{EB}$ was 5.2V under the condition of 50μ A.

After the above-mentioned emitter diffusion, the silicon substrate is dipped for 20 seconds in a 5 percent solution of HF in water held at 20° C to remove from the silicon and the transmuted layer, the phosphosilicate glass film containing phosphorus at a higher concentration, leaving the transmuted layer. A window for the formation of an electrode is opened in the designated portion of the surface of silicon by photo-etching. An Al-Si alloy containing silicon of 10 weight percent is deposited by evaporation on the entire surface of the silicon substrate for the purpose of the formation of the ohmic contact and the interconnection lead, and the patterning is effected by photo-etching. The alloying is performed for 30 minutes at 450° C.

The value $f_T$ or cut off frequency of transistors in integrated circuits thus manufactured was found to be 1.5GHz, the rising time of the AND output of the gate circuit was 1.6 – 1.8 nsec, the decay time 1.4 – 1.7 nsec, and the delay time between input pulse and the AND output pulse was 1.0 – 1.1 nsec. The characteristic of this integrated circuit was not noticeably varied after it had been placed in the air at 337° C for 1000 hours or after it had been operated for 1000 hours at the high junction temperature of 175° C. In the above-described embodiment, silicon dioxide was used as the insulating film for protecting the surface of the silicon substrate, but it was found that silicon nitride can be substituted for the silicon dioxide. We believe this to be due to the fact that, in this case, silicon nitride is oxidized and converted to silicon dioxide by its reaction with phosphosilicate glass, and phosphorus becomes mixed into the silicon dioxide so that the similar passivation effect will be obtained. A silicon dioxide film containing boron, or an alumina film containing boron, can also be used as the surface protecting insulating film. Phosphorus was used as the impurity in the above embodiment to obtain the passivation effect but the same effect can be obtained by boron. By the use of boron, a window of a very small pattern can be correctly and reliably opened.

We claim:

1. A method of manufacturing semiconductor devices comprising the steps of covering the surface of a semiconductor substrate with an insulating film leaving a designated surface portion uncovered by said insulating film and exposed, forming a silicate glass film containing phosphorus on said insulating film and on said surface portion, heating said substrate to diffuse said phosphorus into said semiconductor, forming a transmuted layer having a saturated concentration lower than the concentration of said phosphorus contained in said silicate glass film and having an etching rate lower than the etching rate of said silicate glass film on the interface between said silicate glass film and said insulating film, and removing said silicate glass film from said transmuted layer and from said surface portion by chemical etching, whereby said transmuted layer serves as a passivation layer.

2. A method of manufacturing semiconductor devices comprising the steps of a. opening a base window in a diffusion mask provided on a semiconductor substrate for protecting the substrate surface, at least the surface zone of said semiconductor substrate being of N type;

b. forming a borosilicate glass film on at least said base window;

c. heating said semiconductor substrate to diffuse boron from said borosilicate glass film into said semiconductor substrate;

d. opening an emitter window in said borosilicate glass film formed within said base window;

e. forming a phosphosilicate glass layer on the surface of said semiconductor substrate;

f. performing a diffusion treatment by heating to form a transmuted layer having a saturated concentration of phosphorus lower than the concentration of phosphorus in said phosphosilicate glass layer on the interface between said phosphosilicate glass layer and said diffusion mask; and g. dipping said semiconductor substrate in an etching liquid to remove said phosphosilicate glass layer containing phosphorus at a higher concentration, leaving said phosphorus-containing transmuted layer on the upper surface of said semiconductor substrate.

3. The method of claim 2 wherein said diffusion mask consists of silicon dioxide.

4. The method of claim 2 wherein said diffusion treatment is performed at a temperature exceeding 1000° C but lower than the semiconductor melting temperature.

5. A method according to claim 2, wherein said phosphorus containing transmuted layer is left on the side walls of the emitter window in said borosilicate film.

6. A method of manufacturing semiconductor devices comprising the steps of a. opening a base window in a diffusion mask provided on a semiconductor substrate and protecting the surface of said semiconductor substrate, at least the surface zone of said semiconductor substrate being of N type;

b. depositing boron onto the semiconductor substrate through said base window;

c. heating said substrate in an oxidizing atmosphere to diffuse boron into the interior of the substrate;

d. forming a diffusion mask on the surface of the base;

e. forming an emitter window in said diffusion mask formed within said base window;

f. forming a phosphosilicate glass layer on the surface of said substrate;

g. performing an emitter diffusion treatment by heating to form a transmuted layer having a saturated concentration of phosphorus lower than the concentration of phosphorus in said phosphosilicate glass layer on the interface between said phosphosilicate glass layer and said diffusion mask; and h. dipping said substrate in an etching liquid to remove said phosphosilicate glass layer containing phosphorus at a higher concentration, leaving said phosphorus-containing transmuted layer on the upper surface of said substrate.

7. The method of claim 6 wherein said diffusion mask consists of silicon dioxide.

8. The method of claim 6 wherein said emitter diffusion treatment is performed at a temperature exceeding 1000° C but lower than the semiconductor melting temperature.

9. A method according to claim 6, wherein said phosphorus containing transmuted layer is left on the side walls of the emitter window in said diffusion mask.

* * * * *